United States Patent
Lee

(10) Patent No.: US 7,625,774 B2
(45) Date of Patent: Dec. 1, 2009

(54) METHOD OF MANUFACTURING CMOS IMAGE SENSOR

(75) Inventor: Sang Gi Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 372 days.

(21) Appl. No.: 11/616,746

(22) Filed: Dec. 27, 2006

(65) Prior Publication Data

US 2007/0148808 A1     Jun. 28, 2007

(30) Foreign Application Priority Data

Dec. 28, 2005     (KR) ...................... 10-2005-0132100

(51) Int. Cl.
*H01L 31/18* (2006.01)
(52) U.S. Cl. .......................... 438/60; 438/90; 438/302; 438/305; 438/525; 438/529; 257/E27.133
(58) Field of Classification Search .................. 438/75, 438/76, 90, 91
See application file for complete search history.

(56) References Cited

U.S. PATENT DOCUMENTS

| | | | | |
|---|---|---|---|---|
| 6,027,955 | A | * | 2/2000 | Lee et al. ....................... 438/57 |
| 6,329,233 | B1 | | 12/2001 | Pan et al. |
| 7,345,703 | B2 | * | 3/2008 | Lee .............................. 348/272 |
| 2003/0151076 | A1 | * | 8/2003 | Kim ............................. 257/233 |
| 2005/0151212 | A1 | | 7/2005 | Hong |
| 2006/0243981 | A1 | * | 11/2006 | Rhodes ......................... 257/72 |
| 2007/0148929 | A1 | * | 6/2007 | Lee .............................. 438/527 |
| 2007/0166865 | A1 | * | 7/2007 | Lee .............................. 438/57 |

* cited by examiner

*Primary Examiner*—Stephen W Smoot
(74) *Attorney, Agent, or Firm*—Sherr & Vaughn, PLLC

(57) ABSTRACT

Embodiments relate to a method of manufacturing a CMOS image sensor in which, when a buried photodiode is formed, a p-type impurity region may be formed simultaneously with a p-type LDD region in the photo diode region. Additionally, a p-type impurity region may be formed under side wall spacers, which may reduce leakage current of the photodiode. In embodiments, the method may include providing a semiconductor substrate divided into a pMOS region, a nMOS region, and a diode region, forming a shallow trench isolation (STI) on the semiconductor substrate, opening only the nMOS region and implanting low density n-type impurities to form an n-type LDD region, opening the diode region and pMOS region and implanting impurities to form a p-type impurity region and a p-type LDD region, opening only the diode region and implanting impurities to form an n-type impurity region, forming side wall spacers on both side walls of the gate, opening only the nMOS region and implanting high density n-type impurities to form an n-type source and drain region, and opening only the pMOS region and implanting high density p-type impurities to form p-type source and drain region.

18 Claims, 7 Drawing Sheets

METHOD OF MANUFACTURING CMOS IMAGE SENSOR

The present application claims priority under 35 U.S.C. 119 and 35 U.S.C. 365 to Korean Patent Application No. 10-2005-0132100 (filed on Dec. 28, 2005), which is hereby incorporated by reference in its entirety.

BACKGROUND

Image sensors may be semiconductor devices that convert optical images into electrical signals. Among various image sensors, a CMOS image sensor may be a device that uses a switching mode to sequentially detect an output by providing photodiodes corresponding to the number of pixels through a CMOS technology that uses peripheral devices, such as a control circuit and a signal processing circuit.

A CMOS image sensor may include photodiodes that may sense light. A CMOS image sensor may further include a CMOS logic circuit to process the sensed light, and convert it into electrical signals. The detected light may thereby be represented as data. To improve the photosensitivity, the area occupied by the photodiodes may be increased with respect to the whole area of the image sensor area, or a photo-gathering technology may be used to collect more light in the photodiode area, for example by reducing the light path and/or forming a micro-lens on an upper portion of the photodiodes.

A CMOS image sensor may be divided into various types according to a number of transistors. For example, a CMOS image sensor may be a 3T-type CMOS image sensor, a 4T-type CMOS image sensor, or a 5T-type CMOS image sensor in accordance with the number of transistors. A 3T-type CMOS image sensor may have one photodiode and 3 transistors. A 4T-type CMOS image sensor may have 4 transistors.

FIG. 1 is an example equivalent circuit diagram of a related art 3T CMOS image sensor, and FIG. 2 is an example layout diagram illustrating a unit pixel of the related art 3T CMOS image sensor.

Referring to FIG. 1, the unit pixel of a related art 3T-type CMOS image sensor may include one photodiode and three nMOS transistors T1, T2, and T3. The cathode of photodiode PD may be connected to the drain of first nMOS transistor T1 and the gate of second nMOS transistor T2.

In addition, sources of first and second nMOS transistors T1 and T2 may be connected to a power line that may provide reference voltage VR. A gate of first nMOS transistor T1 may be connected to a reset line that may provide reset signal RST.

The source of third nMOS transistor T3 may be connected to the drain of the second nMOS transistor. The drain of third nMOS transistor T3 may be connected to a reading circuit (not shown) through a signal line. The gate of third nMOS transistor T3 may be connected to a column selection line to which the selection signal SLCT may be supplied.

First nMOS transistor T1 may be referred to as reset transistor Rx, second nMOS transistor T2 may be referred to as drive transistor Dx, and third nMOS transistor T3 may be referred to as selection transistor Sx.

Referring to FIG. 2, in a unit pixel of the related art 3T CMOS image sensor, active region 10 may be defined so that one photodiode 20 may be formed in a wide part of active region 10 and gate electrodes 120, 130, and 140 of the overlapping three transistors may be formed in the remaining part of active region 10.

That is, reset transistor Rx may be formed by gate electrode 120, drive transistor Dx may be formed by gate electrode 130, and selection transistor Sx may be formed by gate electrode 140.

Dopants may be implanted into the part excluding the lower parts of gate electrodes 120, 130, and 140 in active region 10 of the transistor, so that the source and drain regions of the transistors may be formed.

Accordingly, supply voltage Vdd may be applied to the source/drain area between reset transistor Rx and drive transistor Dx, and a source/drain area formed at one side of the select transistor Sx may be connected to a reading circuit (not shown).

Although not shown in the drawing, gate electrodes 120, 130, and 140 may be connected to the signal lines and each signal line may include a pad at one end which may be connected to an external driving circuit.

Hereinafter, a method of manufacturing a related art CMOS image sensor will be described with reference to the attached drawings.

Referring to FIG. 3A, dopants may be selectively implanted into semiconductor substrate 31 so that R-photodiode 81 and G-photodiode 82, that may be respectively configured to sense red and green signals, may be formed in the photodiode region to have different depths.

A prescribed portion of semiconductor substrate 31 may be etched using a hard mask (not shown) such as a nitride layer. This may separate a peripheral circuit region and a pixel region from each other to form a trench. An oxide layer may be deposited to be buried in the trench, and the surface may be planarized, for example by a chemical mechanical polishing (CMP) method, to form a shallow trench isolation (STI) 32.

P-well region 51 may be formed in a region of the pMOS of semiconductor substrate 31 adjacent to where STI 32 may be formed. Gate oxide layer 41 and gate 42 may be sequentially formed on the semiconductor substrate. Low density n-type impurities may be ion implanted into a prescribed portion, for example by a blanket ion implantation method. N-type LDD region 43 may thus be formed in the nMOS transistor region.

First photoresist pattern 91 may be formed so that only the pMOS region may be exposed and low density p-type impurities may be ion implanted using gate 42 as a mask to form p-type LDD region 53 in the pMOS transistor region.

Referring to FIG. 3B, second photoresist pattern 92 may be formed so that only the photodiode region may be exposed and n-type impurities may be ion implanted to form B-photodiode 83.

Referring to FIG. 3C, an oxide layer may be deposited on a surface (for example, on the entire surface) of semiconductor substrate 31 and an etchback process may be performed on the surface to form side wall spacers 40, that may be connected to the sidewalls of gate 42.

Third photoresist pattern 93 may be formed so that only the photodiode region may be exposed and p-type impurities may be ion implanted to form p-type impurity region 83a in B-photodiode 83. Accordingly, the buried B-photodiode may be completed.

Referring to FIG. 3D, a surface of semiconductor substrate 31 may be coated with photoresist (not shown). Patterning may be performed so that only the nMOS transistor region may be exposed, and the n-type impurities such as arsenic (As) may be ion implanted to form n-type source and drain region 44.

Finally, the photoresist may be removed, another photoresist may be applied, patterning may be performed such that only the pMOS transistor region may be exposed, and p-type impurities such as boron (B) may be ion implanted to form p-type source and drain region 54.

Hence, n-type source and drain region 44 and p-type source and drain region 54 may have narrower areas than n-type LDD region 43 and p-type LDD region 53 by the width of side spacers 40.

However, the related art method of manufacturing the CMOS image sensor described above may have various problems.

For example, to form the buried photodiode, the deep n-type impurity region may be used to form the B-photodiode, sidewall spacers may be formed on the adjacent gate sidewalls, and the p-type impurity ion may be implanted into the surface of the n-type impurity region to complete the buried photodiode. To form a buried photodiode, a PDP process of implanting the p-type impurity ion may be added. This may be a complicated process.

Furthermore, after forming the side spacers, the p-type impurity region may be formed. Current may leak under the side spacers. In the related art technology, there may be limitations on solving the problem of leaking the current.

SUMMARY

Embodiments relate to a method of manufacturing a CMOS image sensor. Embodiments relate to a method of manufacturing a CMOS image sensor, in which processes of dopant implantation are minimized in a vertical-type CMOS image sensor to simply form a buried B-photodiode.

Embodiments relate to a method of manufacturing a CMOS image sensor in which, when a buried photodiode may be formed, a p-type impurity region may be formed simultaneously with a p-type LDD region in the photo diode region so that one step is reduced, thereby simplifying the manufacturing process and in which the p-type impurity region may be formed under side wall spacers to improve the leakage current of the photodiode.

According to embodiments, a method of manufacturing a CMOS image sensor may include providing a semiconductor substrate divided into a pMOS region, a nMOS region, and a diode region, forming a shallow trench isolation (STI) on the semiconductor substrate, opening only the nMOS region and implanting low density n-type impurities to form an n-type LDD region, opening the diode region and pMOS region and implanting impurities to form a p-type impurity region and a p-type LDD region, opening only the diode region and implanting impurities to form an n-type impurity region, forming side wall spacers on both side walls of the gate, opening only the nMOS region and implanting high density n-type impurities to form an n-type source and drain region, and opening only the pMOS region and implanting high density p-type impurities to form p-type source and drain region.

DETAILED DESCRIPTION OF EMBODIMENTS

Figure 1:
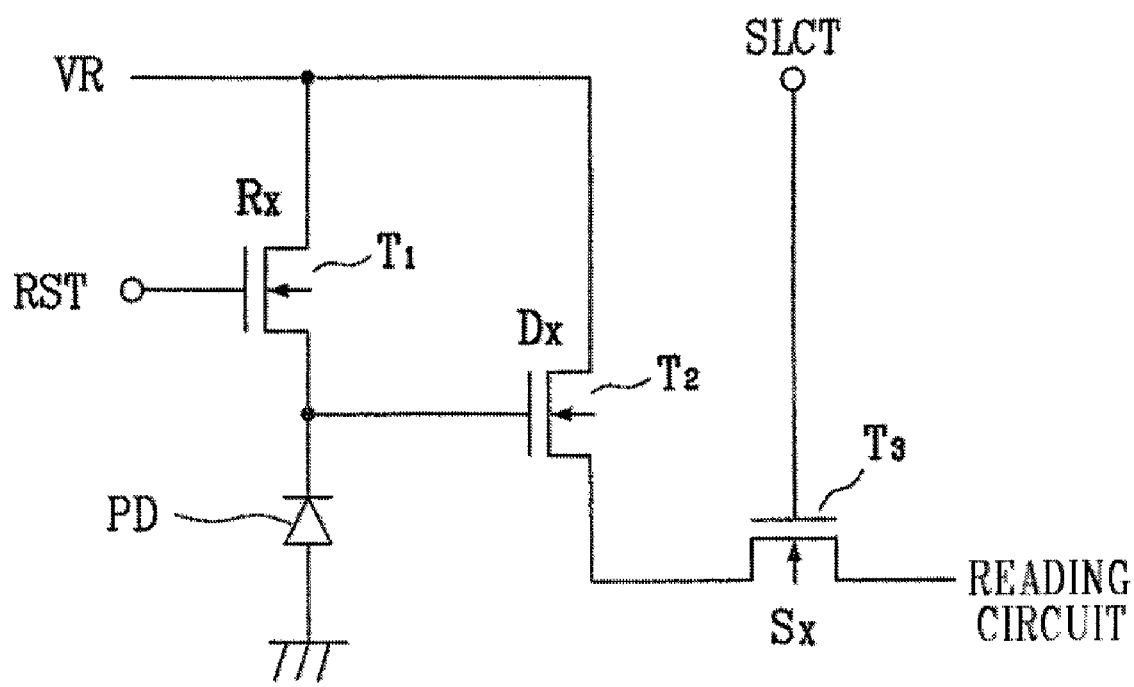
FIG. 1 is an example circuit diagram of a related art 3T-type CMOS image sensor.
Figure 2:
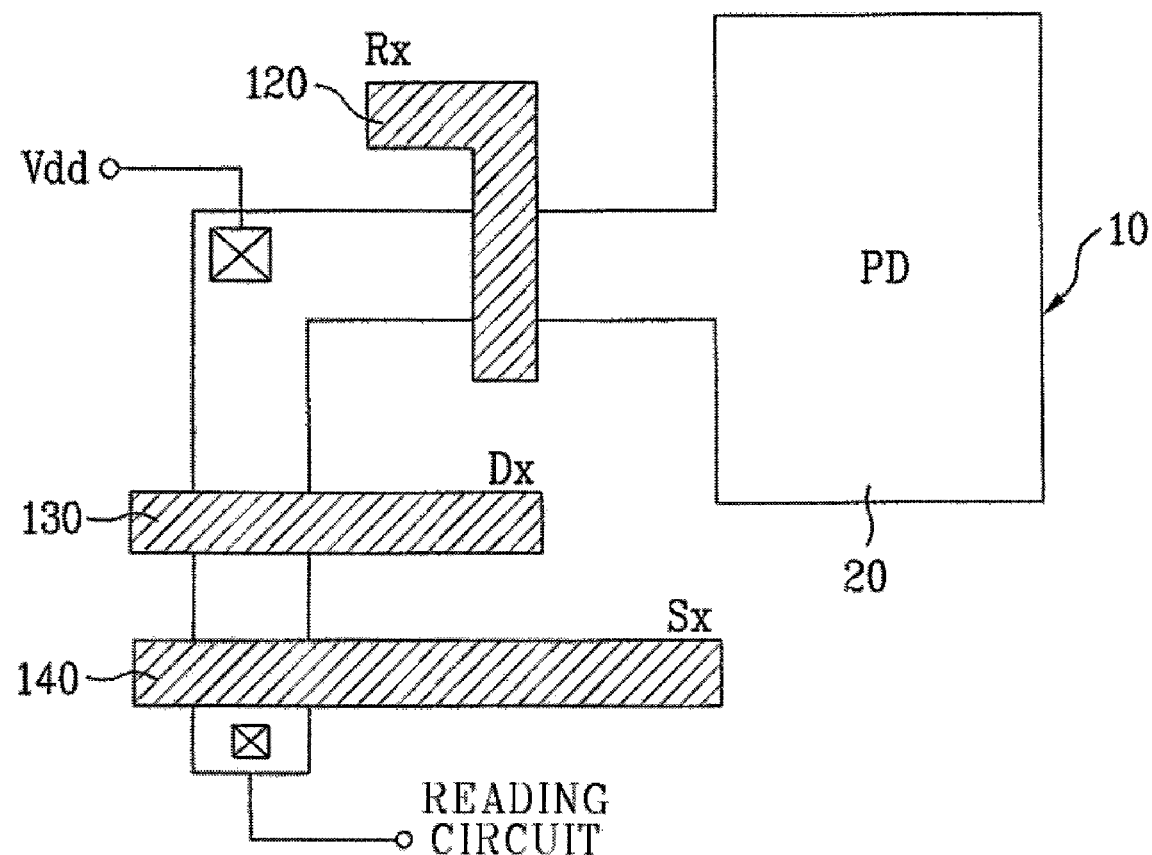
FIG. 2 is an example layout diagram illustrating a unit pixel of a related art 3T-type CMOS image sensor.
Figure 3A:
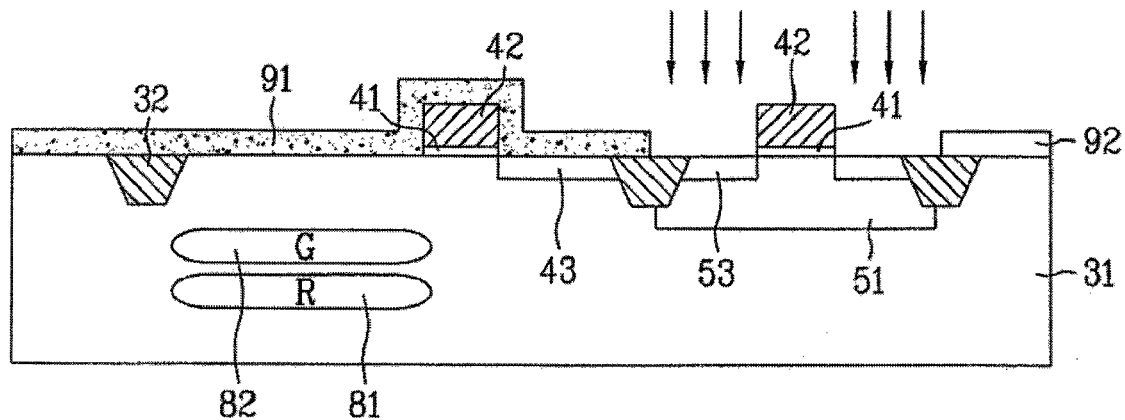
FIGS. 3A to 3D are example sectional views illustrating a CMOS image sensor and a method of manufacturing a CMOS image sensor having a related art vertical photodiode structure.
Figure 3B:
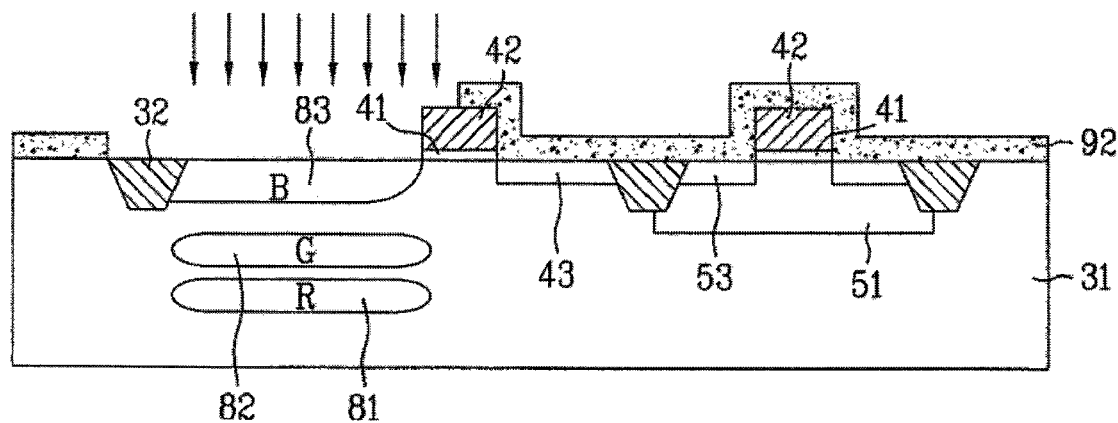
Figure 3C:
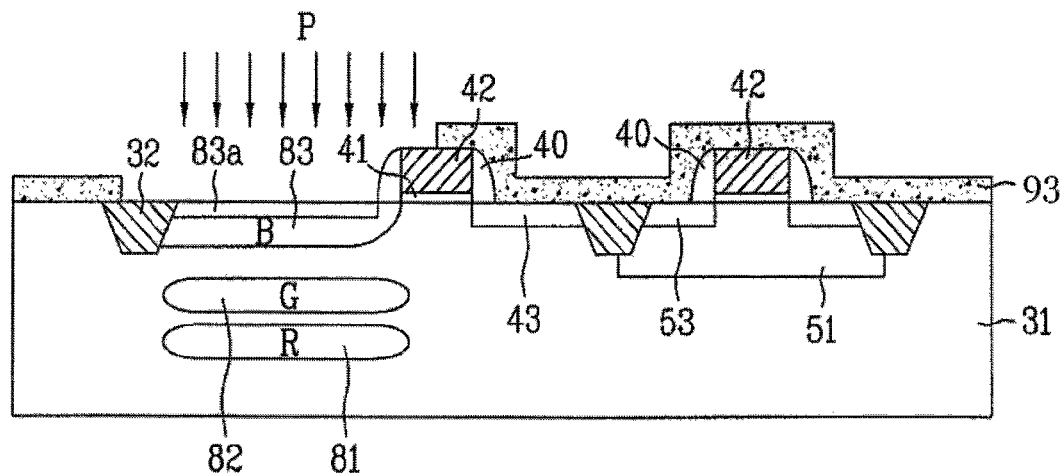
Figure 3D:
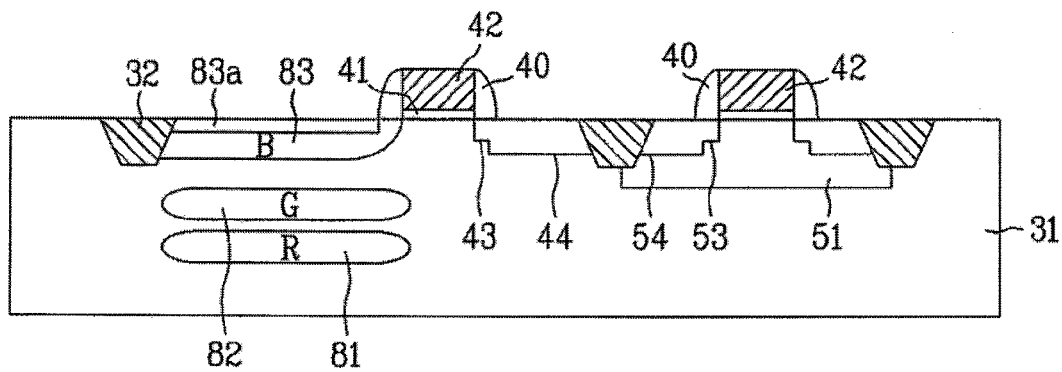
Figure 4A:
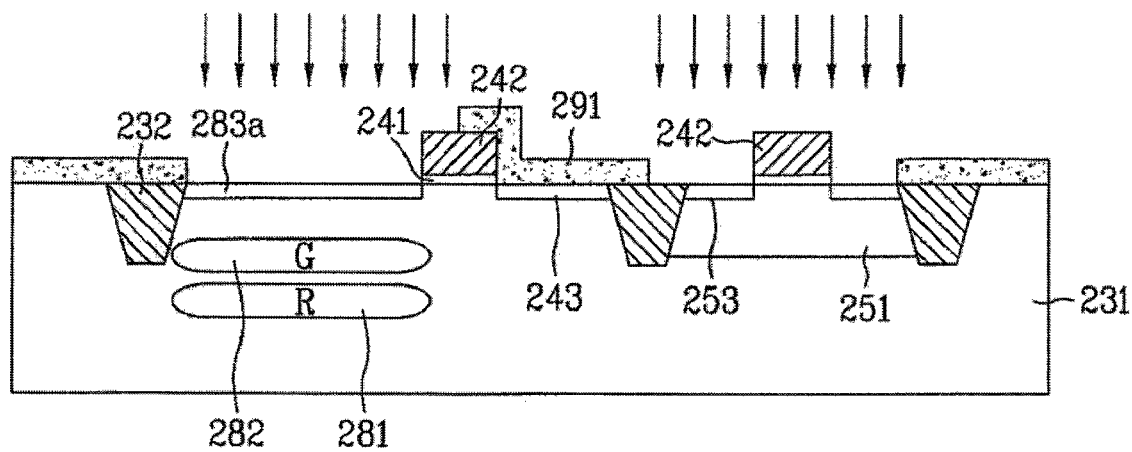
FIGS. 4A to 4F are sectional views illustrating a CMOS image sensor and a method of manufacturing a CMOS image sensor having a vertical photodiode structure according to embodiments.

Referring to FIG. 4A, impurity ions may be selectively implanted into semiconductor substrate 231, and may sequentially form R-photodiode 281 and G-photodiode 282, which may be respectively configured to sense red and green signals in a photodiode region. R-photodiode 281 and G-photodiode 282 may be formed to have different depths.

To separate a peripheral circuit region and a pixel region from each other, a prescribed portion of semiconductor substrate 231 may be anistropically etched using a hard mask (not shown) such as a nitride layer. This may form a trench. An oxide layer may be deposited to fill in the trench, and the surface may be planarized, for example by a chemical mechanical polishing (CMP) method. Shallow trench isolation (STI) 232 may thus be formed.

P-well region 251 may be formed in a pMOS region of semiconductor substrate 231, adjacent to STI 232. An oxide layer and polysilicon may be sequentially deposited on semiconductor substrate 231, and patterning may be performed using a gate mask to form gate oxide layer 241 and gate 242.

In embodiments, the gate may be formed of a single layer of polysilicon. In embodiments, the gate, however, may be formed by laminating metal on the gate for the specific resistance and the high speed resistance of the gate. The metal may be used as a diffusion preventing layer, a laminating layer of tungsten, and tungsten silicide.

The resultant material may be covered with a photoresist pattern (not shown) so that only a nMOS transistor region may be exposed and low density n-type impurities may be ion implanted into a prescribed part, for example by a blanket ion implantation method. Accordingly, n-type LDD region 243 may be formed in the nMOS transistor region.

The resultant material may be covered with first photoresist pattern 291 (as shown in FIG. 4A) so that only the pMOS transistor region and the diode region may be exposed and low density p-type impurities may be ion implanted. This may simultaneously form p-type LDD region 253 in the pMOS transistor region and p-type impurity region 283a in the diode region.

When the p-type LDD region 253 may be formed, p-type impurity region 283a may be simultaneously formed. This may simplify processes. The p-type impurity regions may be formed before forming the side wall spacers. Accordingly, a diode junction may be formed under the sidewall spacers. Hence, since the p-type impurity region may be formed under the sidewall spacers, current leakage that may have been generated under the sidewall spacers may be prevented.

In embodiments, the low density p-type impurity ions may be implanted in p-type LDD region 253 and p-type impurity region 283a. Since the pMOS may be formed only in a peripheral circuit, it may not matter in controlling performance.

Figure 4B:
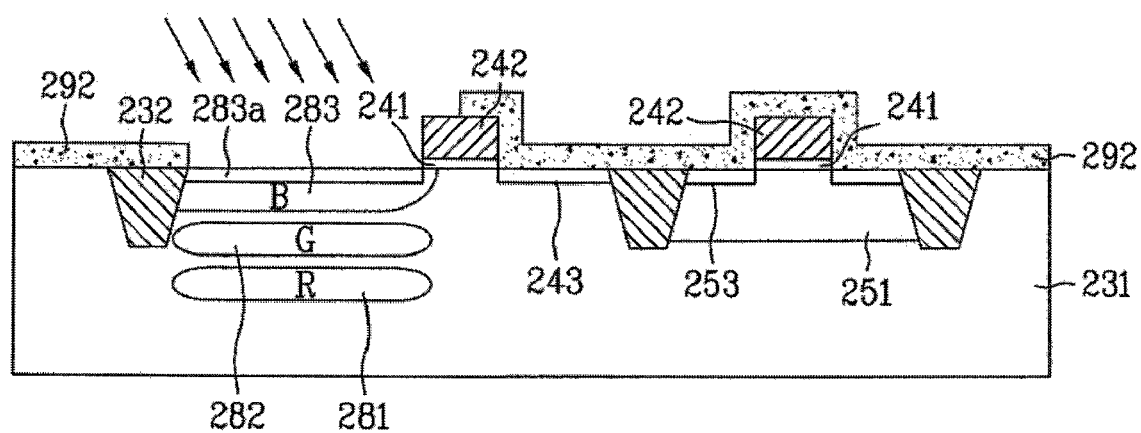

Referring to FIG. 4B, the resultant material may be covered with second photoresist pattern 292 so that only the diode region may be exposed and n-type impurities may be ion implanted to form an n-type impurity region. In embodiments, the n-type impurity region may be formed to be deeper than the p-type impurity region. The n-type impurity region may become B-photodiode 283 so that a buried B-photodiode may be completed. In embodiments, when the n-type ion is implanted, ions may be implanted at an angle of approximately 4 to 7 degrees. Accordingly, a diode junction may be formed under p-type impurity region 283a. In embodiments, and amount of implanted ions may be controlled so that a photodiode may be formed.

Thus, second photoresist pattern 292 may be formed so that only a diode region may be exposed and n-type impurities such as As may be ion implanted to form B-photodiode 283, which may sense blue light. Second photoresist pattern 292 may be removed.

Figure 4C:
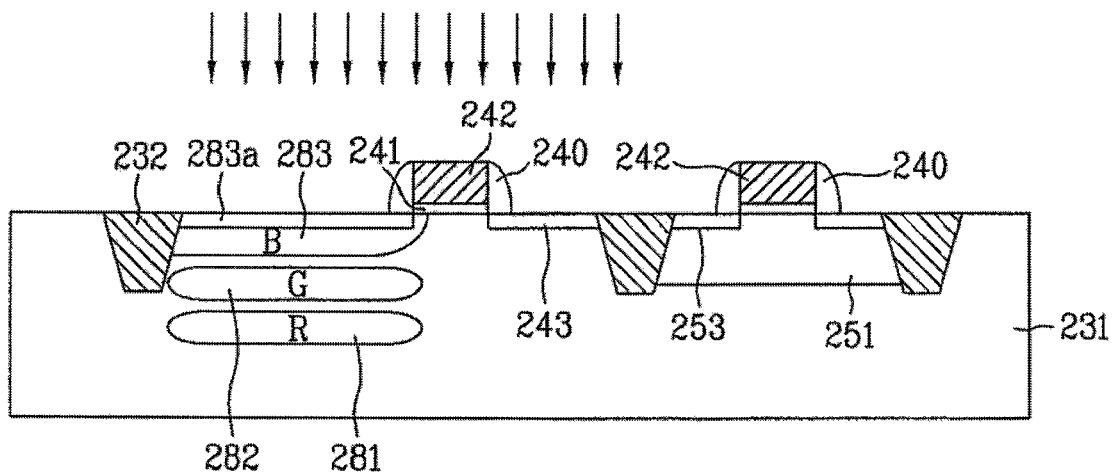

Referring to FIG. 4C, an oxide layer or a nitride layer may be deposited on the surface of semiconductor substrate 231 and may be etched back to form sidewall spacers 240, that may be connected to the side walls of gate 242.

Figure 4D:
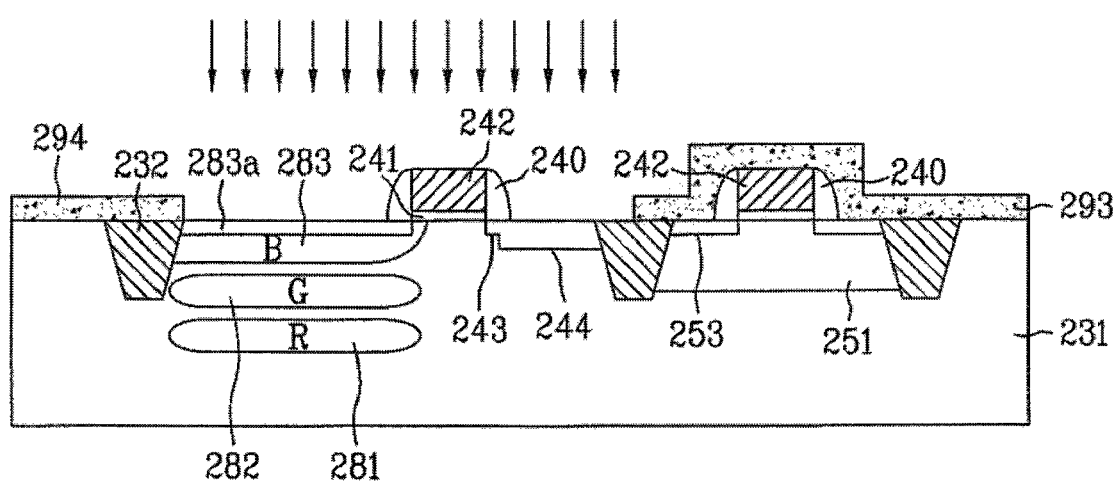

Referring to FIG. 4D, the resultant material may be covered with third photoresist pattern 293 so that only the nMOS transistor may be opened and n-type impurity such as As may be ion implanted. This may form n-type source and drain region 244. In embodiments, since B-photodiode 283 may be an n-type impurity region, it may not be necessary to cover the diode region with the third photoresist pattern.

Figure 4E:
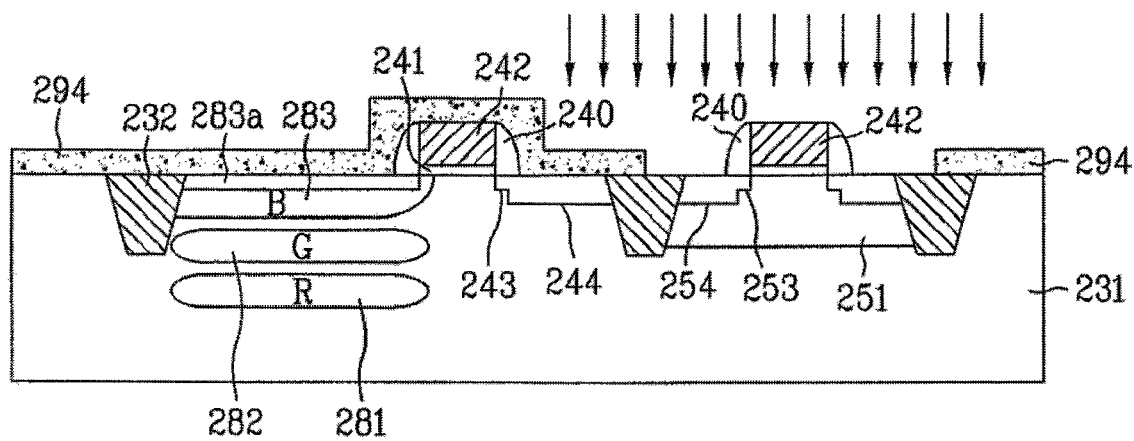

Referring to FIG. 4E, the resultant material may be covered with fourth photoresist pattern 294. Third photoresist pattern 293 may be removed and only the pMOS transistor region may be exposed and a p-type impurity such as B may be ion implanted, and may form p-type source and drain region 254.

Figure 4F:
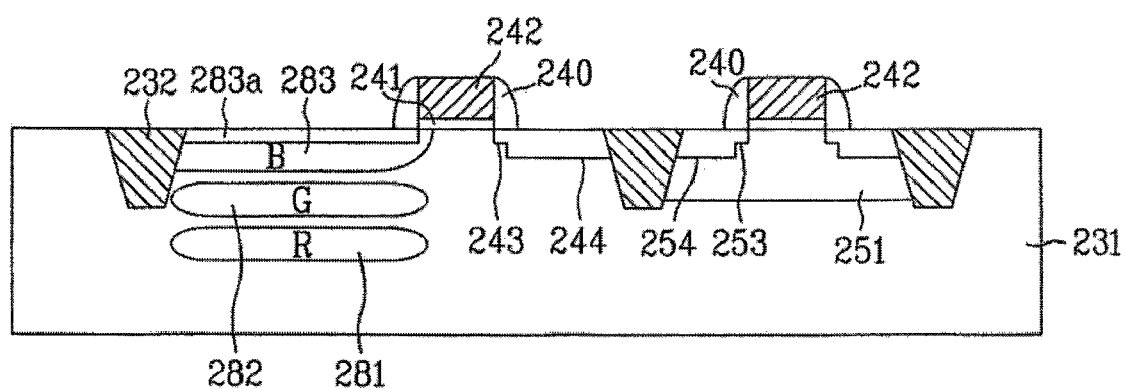

Referring to FIG. 4F, when fifth photoresist pattern 295 may be removed. A buried photodiode, whose surface may include p-type impurity region 283a, may thus be completed. According to embodiments, As may be used when n-type impurity ions are implanted and B may be used when p-type impurity ions are implanted.

Although not illustrated, an interlayer insulating layer may be formed on a surface including the gate. Additionally, a source and drain electrode connected to the source and drain region may be formed by passing through the interlayer insulating layer. Accordingly, the transistor of the semiconductor device may be completed. Then, a logic process may be completed through an interconnection process. A CMOS image sensor may thus be completed.

A method of manufacturing the CMOS image sensor according to embodiments may have various effects and/or benefits.

For example, if a buried photodiode is formed and the p-type LDD region is formed, the p-type impurity region may be simultaneously formed in the photodiode region so that it may be possible to reduce at least one step, which may simplify processes. That, the buried photodiode may be formed by a more simplified processes.

In addition, before forming the sidewall spacers, the p-type impurity region may be formed in the diode region so that the p-type impurity region may be formed on a surface of the sidewall spacers. Therefore, it may be possible to prevent the surface from being damaged and to thus prevent current of the B-photo diode from leaking.

Moreover, since it may be possible to make the junction capacitance on the B-photodiode different from the junction capacitance under the B-photodiode, it may be possible to improve the dynamic range of the B-photodiode.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
    providing a semiconductor substrate divided into a pMOS region, an nMOS region, and a diode region;
    forming a shallow trench isolation (STI) in the semiconductor substrate;
    forming at least one gate over the semiconductor substrate;
    exposing only the nMOS region and implanting low density n-type impurities to form an n-type LDD region;
    exposing the diode region and pMOS region and implanting impurities to form a p-type impurity region and a p-type LDD region; and
    exposing only the diode region and implanting impurities to form an n-type impurity region.

2. The method of claim 1, further comprising:
    forming side wall spacers on side walls of the at least one gate;
    exposing only the nMOS region and implanting high density n-type impurities to form an n-type source and drain region; and
    exposing only the pMOS region and implanting high density p-type impurities to form a p-type source and drain region.

3. The method of claim 2, wherein the sidewall spacers are formed after forming the p-type impurity region.

4. The method of claim 2, wherein, in the step of ion implanting the n-type impurity to form the n-type source and drain region, the diode region is exposed and n-type impurities are simultaneously ion implanted.

5. The method of claim 1, wherein the p-type impurity region and the p-type LDD region are simultaneously formed by a single impurity ion implantation when exposing the diode region and the pMOS region and implanting impurities to form the p-type impurity region and the p-type LDD region.

6. The method of claim 1, wherein low density p-type impurity ions are implanted when the diode region and the pMOS region are exposed and the p-type impurity region and the p-type LDD region are formed.

7. The method of claim 1, wherein n-type impurity ions are implanted at an angle of approximately 4 to 7 degrees when only the diode region is exposed and the n-type impurity region is formed.

8. The method of claim 7, wherein a diode junction is formed on a bottom of the p-type impurity region under the at least one gate when the n-type impurities are implanted at the angle.

9. The method of claim 1, wherein a buried B-photodiode is formed by exposing only the diode region and implanting impurities to form the n-type impurity region.

10. The method of claim 9, wherein the n-type impurity region is formed to be deeper than the p-type impurity region.

11. The method of claim 1, further comprising forming an R-photodiode and a G-photodiode in the diode region before forming the STI in the semiconductor substrate,
    wherein a buried B-photodiode is formed by exposing only the diode region and implanting impurities to form the n-type impurity region.

12. The method of claim 11, wherein the R-photodiode, G-photodiode, and the buried B-photodiode vertically overlap each other.

13. The method of claim 1, further comprising forming a p-well region in the pMOS region before forming the gate on the semiconductor substrate.

14. The method of claim 1, further comprising a gate oxide layer formed under the gate.

15. The method of claim 1, wherein the n-type impurity region comprises arsenic (As).

16. The method of claim 1, wherein the p-type impurity region comprises boron (B).

17. A method, comprising:
    dividing a semiconductor substrate into a pMOS region, an nMOS region, and a diode region, the semiconductor substrate including at least one gate electrode;

forming a shallow trench isolation (STI) in the semiconductor substrate;

exposing only the nMOS region and implanting low density n-type impurities to form an n-type LDD region;

exposing the diode region and pMOS region and implanting impurities to simultaneously form a p-type impurity region and a p-type LDD region by a single implantation process;

exposing only the diode region and implanting impurities to form an n-type impurity region;

forming side wall spacers on side walls of the at least one gate electrode after forming the p-type impurity region;

exposing only the nMOS region and the diode region and simultaneously implanting high density n-type impurities to form an n-type source and drain region; and exposing only the pMOS region and implanting high density p-type impurities to form p-type source and drain region.

18. The method of claim 17, wherein the n-type impurity ions are implanted at an angle of approximately 4 to 7 degrees when only the diode region is exposed and the n-type impurity region is formed.

* * * * *